US011551932B2

(12) United States Patent
Kwon et al.

(10) Patent No.: US 11,551,932 B2
(45) Date of Patent: Jan. 10, 2023

(54) PHOTONUCLEAR TRANSMUTATION DOPING IN GALLIUM-BASED SEMICONDUCTOR MATERIALS

(71) Applicant: The Curators of the University of Missouri, Columbia, MO (US)

(72) Inventors: Jae Wan Kwon, Columbia, MO (US); Quang Nguyen, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 16/905,506

(22) Filed: Jun. 18, 2020

(65) Prior Publication Data

US 2020/0402802 A1    Dec. 24, 2020

Related U.S. Application Data

(60) Provisional application No. 62/863,010, filed on Jun. 18, 2019.

(51) Int. Cl.
*H01L 21/00* (2006.01)
*H01L 21/261* (2006.01)
*H01L 21/02* (2006.01)

(52) U.S. Cl.
CPC ........ *H01L 21/261* (2013.01); *H01L 21/0254* (2013.01); *H01L 21/02614* (2013.01)

(58) Field of Classification Search
CPC ............. H01L 21/261; H01L 21/02614; H01L 21/02538; H01L 21/0254; H01L 21/02565
See application file for complete search history.

(56) References Cited

U.S. PATENT DOCUMENTS

| 4,025,365 A * | 5/1977 | Martin ................... C30B 31/20 438/512 |
| 4,910,156 A | 3/1990 | Takasu et al. |
| 6,114,225 A * | 9/2000 | Liao ..................... H01L 21/263 257/E21.33 |
| 2003/0134493 A1 * | 7/2003 | Cho .................... H01L 21/3245 438/512 |
| 2015/0243629 A1 * | 8/2015 | Herbots ............... H01L 21/187 438/455 |
| 2017/0179238 A1 * | 6/2017 | Cheng ................ H01L 29/1608 |

OTHER PUBLICATIONS

Akkoyun, S., et al., "Photonuclear Reaction Cross Sections for Gallium Isotopes," 2015, NUBA Conference Series—1: Nuclear Physics and Astrophysics, J Phys: Conference Series 590 012047, IOP Publishing Ltd., 4 pages.

(Continued)

*Primary Examiner* — Reema Patel
(74) *Attorney, Agent, or Firm* — Stinson LLP

(57) ABSTRACT

The present invention relates to various high quality n-type and p-type doped gallium-based semiconductor materials, electronic components incorporating these materials, and processes of producing these materials. In particular, The present invention relates processes to achieve high quality, uniform doping of a whole wafer or a thin layer of gallium-based semiconductor materials for various applications such as a vertical power transistor or diode.

17 Claims, 8 Drawing Sheets

(56) References Cited

OTHER PUBLICATIONS

Boztosun, I., et al., "Photonuclear Reactions Induces by a Clinical Linac," 2015, 2015, NUBA Conference Series—1: Nuclear Physics and Astrophysics, J Phys: Conference Series 590 012024, IOP Publishing Ltd., 6 pages.
Findlay, D.J.S., et al., "Photonuclear Transmutation Doping of Semiconductors," 1988, Semicond Sci Technol 3:388-396, 9 pages.
Kwon, J., "High Quality Doping of GaN Through Transmutation Process," Jun. 19, 2019, University of Missouri—Columbia, ARPA-e Presentation, 19 pages.
Lyons, J.L., et al., "Shedding Light on Doping of Gallium Nitride, State-of-the-Art Calculations Predict Unexpected Behavior from the Only Known p-type Dopant," Jul. 19, 2012, SPIE The International Society for Optics and Photonics, SPIE Digital Ligrary, Optics.Org, 3 pages.
Kuriyama, K., et al., "Lattice Distortions and the Transmuted-Ge Related Luminescence in Neutron-Transmutation-Doped GaN," 2002, Appl Phys Lett, 80/3328, Abstract Only. 1 page.
Polyakov, A.Y., et al., "Neutron Transmutation Doping Effects in GaN," 2010, J Vacuum Sci & Technol B, 28/608, Abstract Only. 1 page.

* cited by examiner

PHOTONUCLEAR TRANSMUTATION DOPING IN GALLIUM-BASED SEMICONDUCTOR MATERIALS

CROSS REFERENCE TO RELATED APPLICATIONS

This application claims the benefit of U.S. Provisional Patent Application No. 62/863,010, filed Jun. 18, 2019, the entirety of which is incorporated herein by reference.

GOVERNMENT LICENSE RIGHTS

This invention was made with Government support under DE-AR0000874 awarded by the Department of Energy. The Government has certain rights in the invention.

FIELD OF THE INVENTION

The present invention relates to various high quality n-type and p-type doped gallium-based semiconductor materials, electronic components incorporating these materials, and processes of producing these materials. In particular, The present invention relates processes to achieve high quality, uniform doping of a whole wafer or a thin layer of gallium-based semiconductor materials for various applications such as in vertical power transistors or diodes.

BACKGROUND OF THE INVENTION

Power semiconductor devices play a crucial role in modern society. The need to regulate and control electrical energy better and more efficiently has increased rapidly in recent years. However, silicon-based power semiconductor devices have reached their theoretical limit and cannot meet growing demands. GaN with superior properties can replace Si for new generation of power semiconductors. Vertical GaN power devices have received significant attention in recent years, with a very high breakdown voltage of over 1 kV. Achieving high quality and uniform doping GaN wafers or very thick GaN layers is therefore crucial to the development of vertical GaN power devices.

Currently, there are four main processes to dope GaN materials: diffusion, ion implantation, doping during GaN growth, and neutron transmutation doping (NTD). The diffusion doping process involves depositing the doping material on the surface of the GaN semiconductor before annealing it to diffuse the dopant into the GaN lattice. In an ion implantation doping process, high energy dopant ions are first driven into a GaN wafer using various processes. The GaN wafer is later annealed at high temperature to defuse the dopant atoms further into the GaN lattice. One drawback of these processes relates to the gradient profile of the doping concentration. The doping concentration is usually much higher on the surface, which affects the operation of the GaN semiconductor device. Doping during growth processes partially solves this problem with a more uniform distribution of dopant. However, extensive modifications to the growth process are required. Moreover, the quality of the wafer is affected, especially on the surface.

Neutron transmutation can provide an exceptionally uniform doping profile for GaN. This process involves irradiating the GaN wafers with a neutron source in a nuclear reactor. The interaction with a neutron turns Ga atom into Ge, an n-type dopant, for GaN. This process provides a very uniform doping profile of Ge in GaN lattice, and can also be conducted after the GaN wafer growth process. Therefore, neutron transmutation can result in a high quality, highly doped n-type GaN wafer. Neutron transmutation solves most of the problems of the aforementioned processes. However, it is not possible to transmute Ga to Zn or other p-type dopants for GaN with neutron transmutation processes of GaN. Accordingly, there remains a need for new doping processes that can achieve high quality and uniform doping of gallium-based semiconductor materials, particularly with p-type dopants.

BRIEF SUMMARY OF THE INVENTION

Various aspects of the present invention are directed to processes of producing a doped gallium-based semiconductor material. For example, various processes comprise irradiating a gallium-based semiconductor workpiece with gamma rays to effect transmuting at least a portion of Ga in the workpiece to Zn and/or Ge to produce the doped gallium-based semiconductor material.

Further aspects of the present invention are directed to doped gallium-based semiconductor materials produced by the processes described herein as well as electronic components, such as power semiconductors, transistors, and diodes, incorporating these materials.

Still other aspects of the invention relate to various semiconductor materials comprising two or more different types of regions. In some embodiments, the semiconductor material comprises: a first region comprising a doped gallium-based material (e.g., Zn-doped GaN or Ge-doped GaN as described herein); and a second region comprising an undoped gallium based material (e.g., GaN). In certain embodiments, the semiconductor material comprises: a first region comprising a doped p-type gallium-based material (e.g., Zn-doped GaN); and a second region comprising a n-type doped gallium based material (e.g., Ge-doped GaN). This material can further include a third region comprising an undoped gallium-based material (e.g., GaN).

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE INVENTION

Figure 1A:
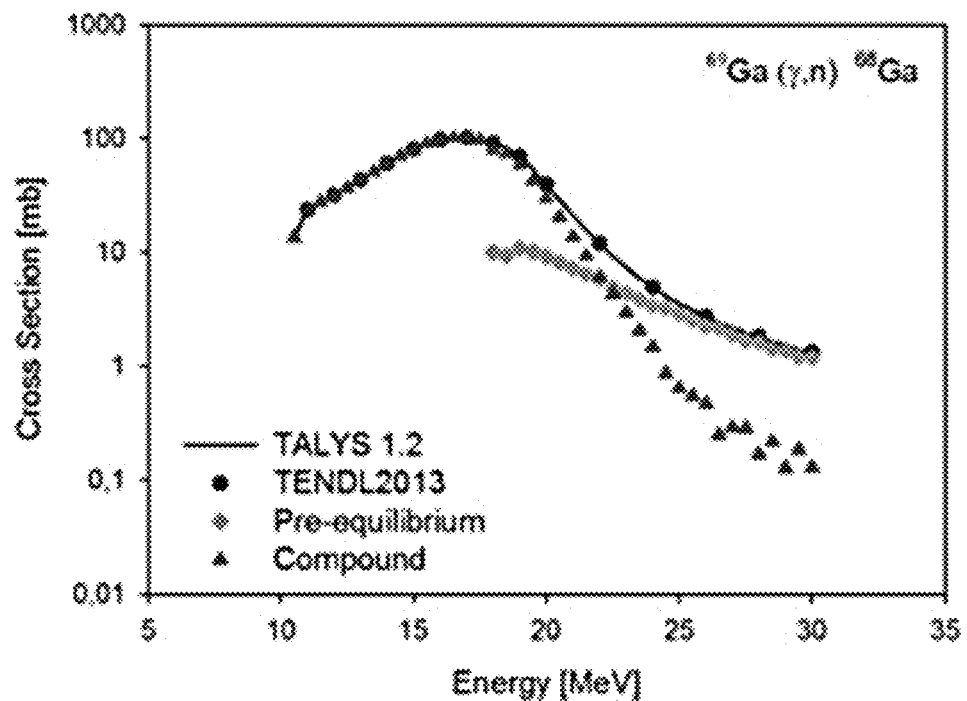
FIGS. 1A, 1B, 1C, and 1D. The cross-sections of the photonuclear reactions ($\gamma$,1n), ($\gamma$,1p), ($\gamma$,2n), ($\gamma$,2p) of $^{69}$Ga, respectively, calculated using the TALYS 1.2 program.
Figure 1B:
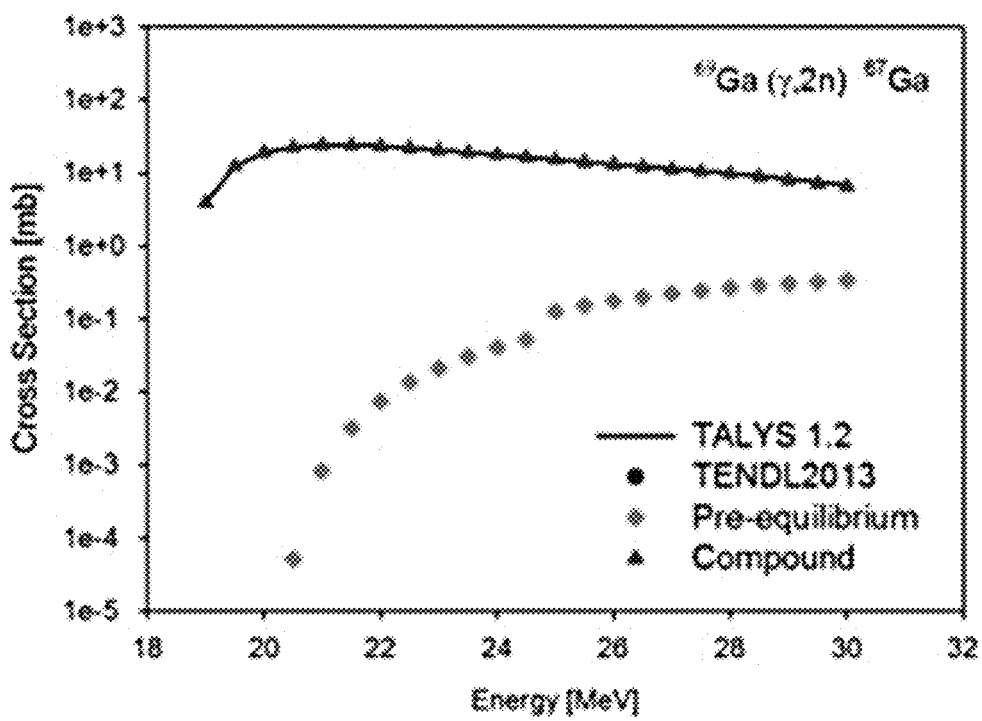
Figure 1C:
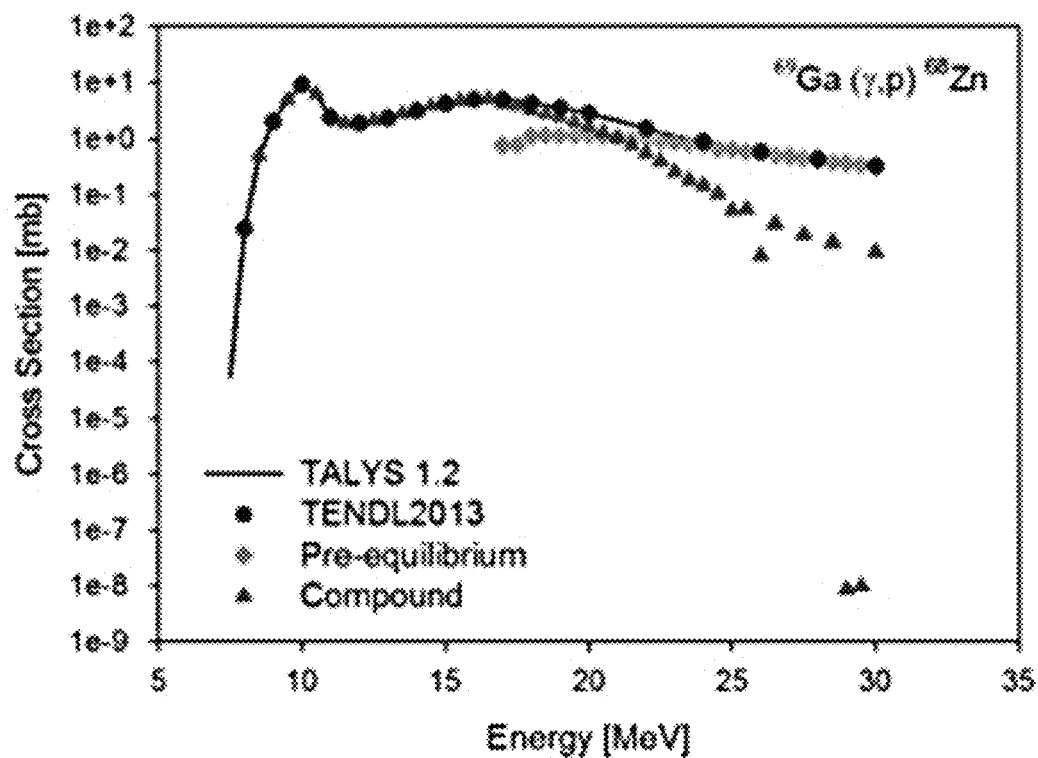
Figure 1D:
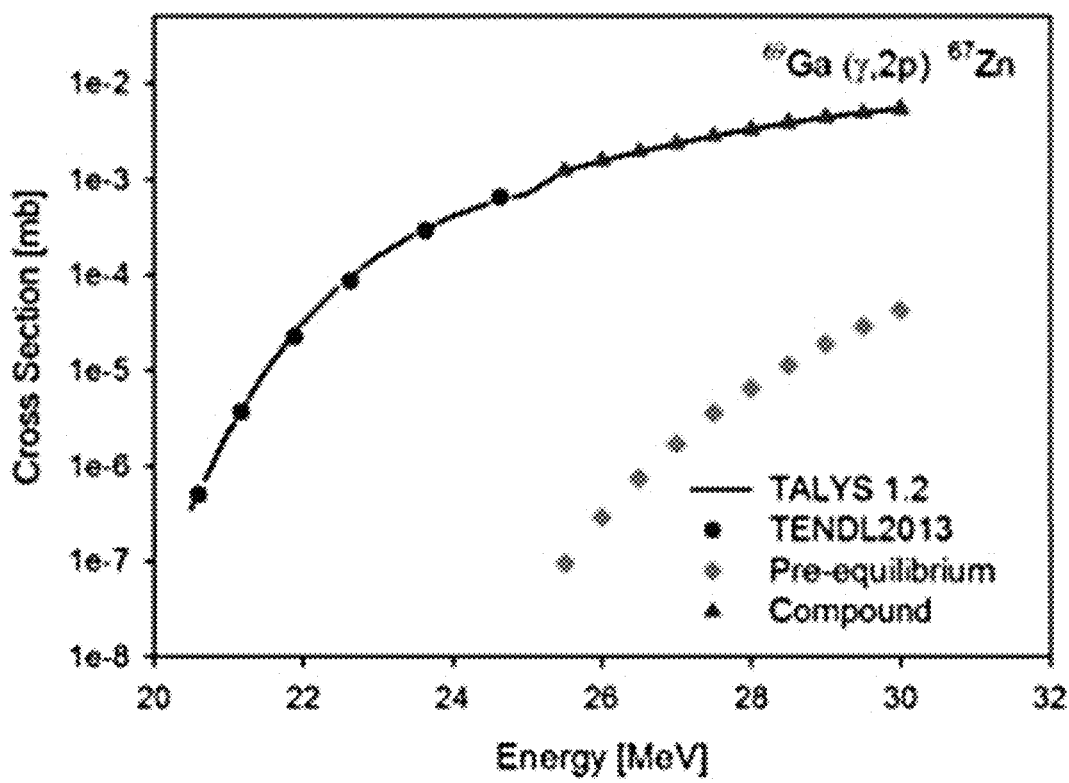
Figure 2A:
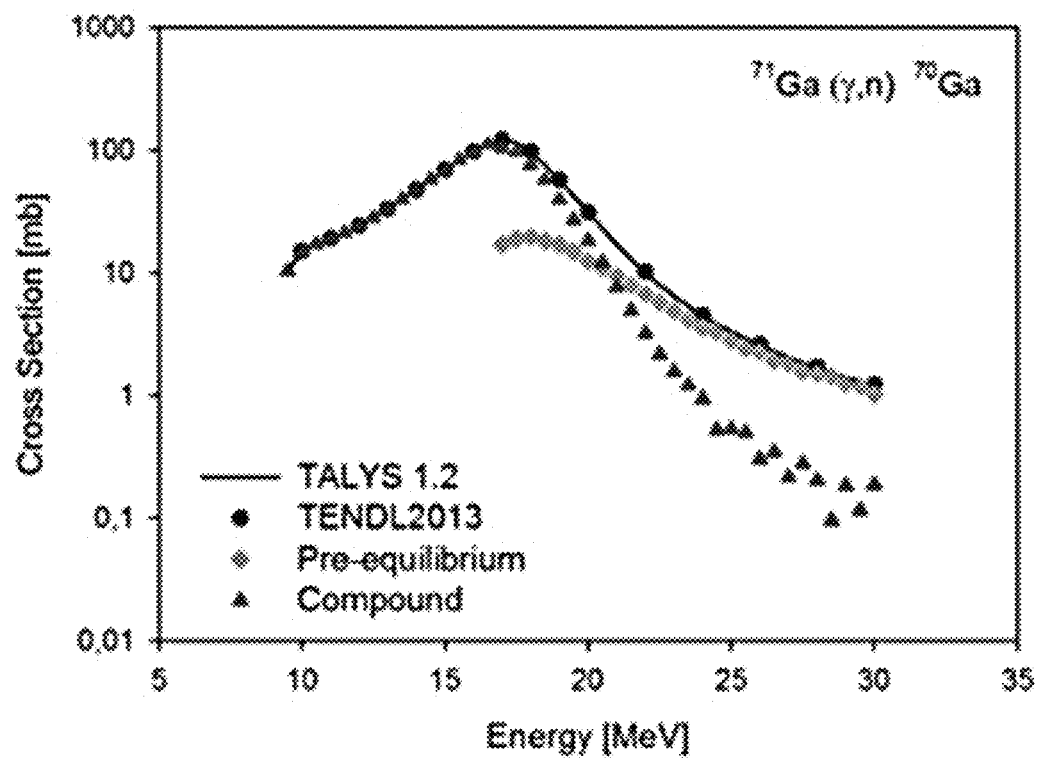
FIGS. 2A, 2B, 2C, and 2D. The cross-sections of the photonuclear reactions ($\gamma$,1n), ($\gamma$,1p), ($\gamma$,2n), ($\gamma$,2p) of $^{71}$Ga, respectively, calculated using the TALYS 1.2 program.
Figure 2B:
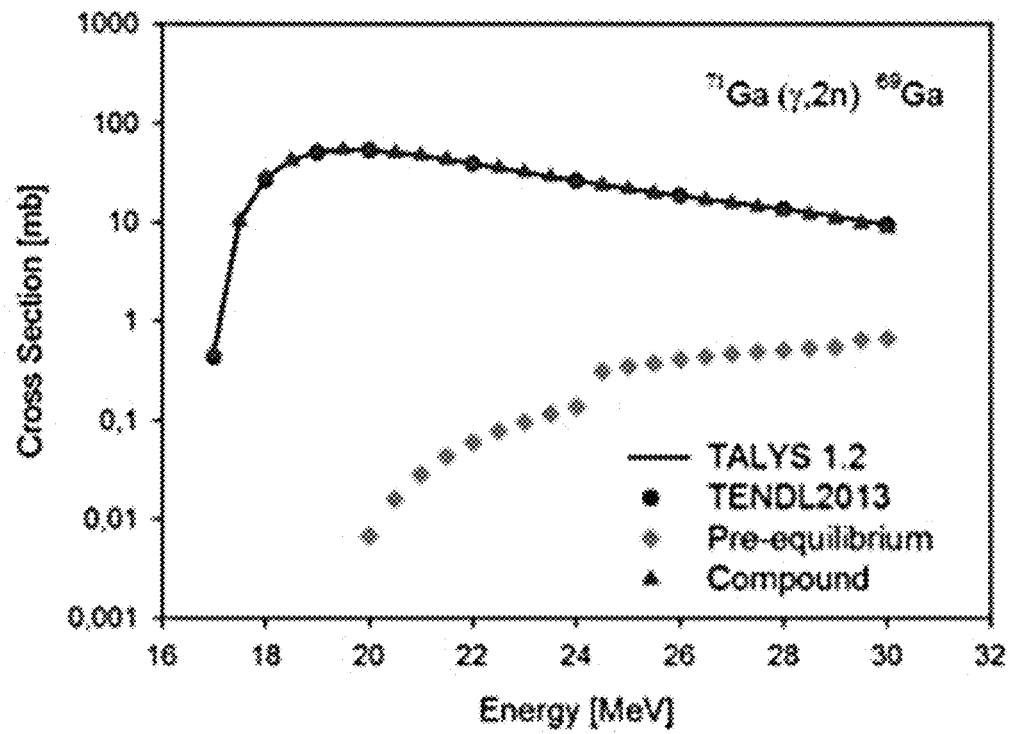
Figure 2C:
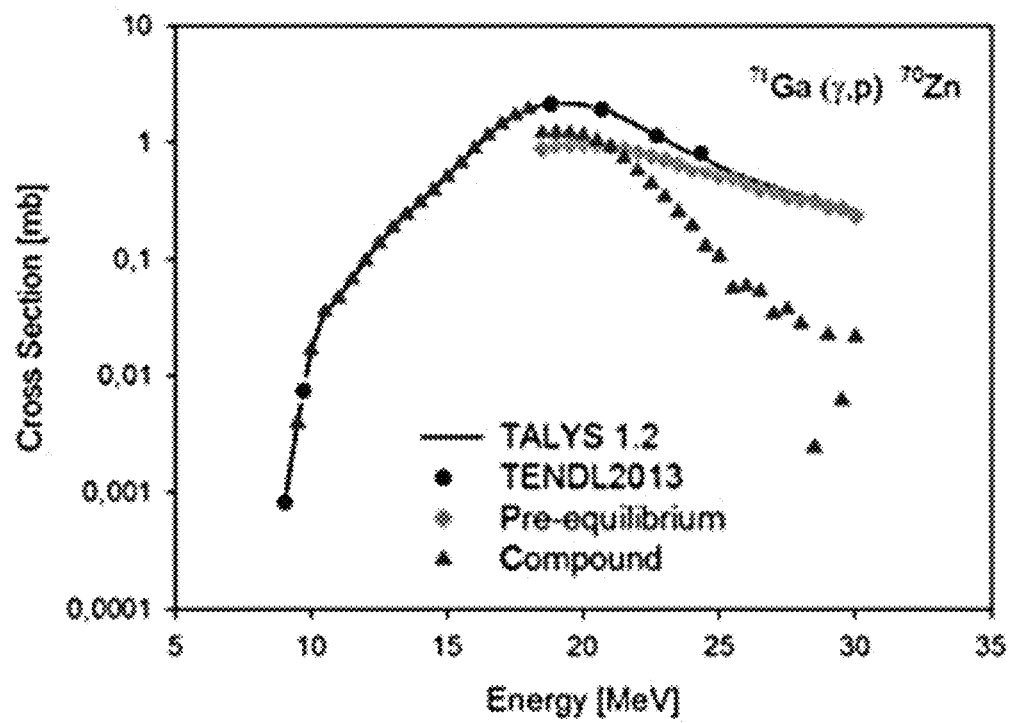
Figure 2D:
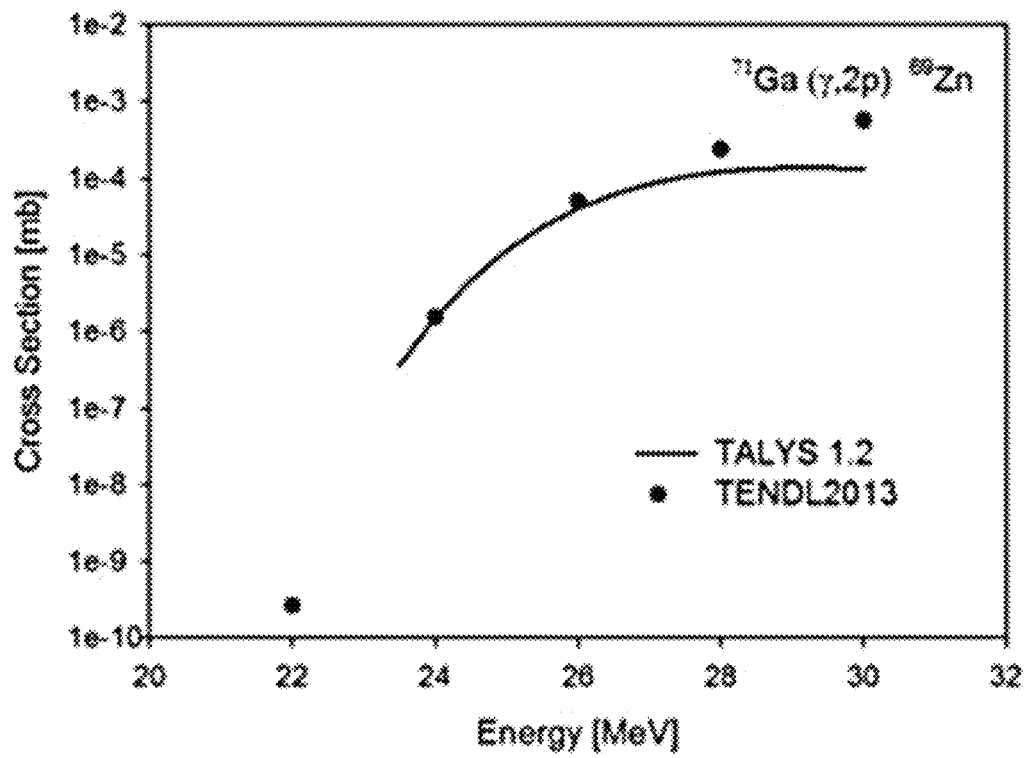

In general, the present invention relates to various high quality n-type and p-type doped gallium-based semiconductor materials, electronic components incorporating these materials, and processes of producing these materials. Various processes described herein utilize the photonuclear reaction for the n-type and p-type doping process of gallium-based semiconductor materials (e.g., GaN wafers). Photonuclear reactions are reactions generated by photon radiation. In a photonuclear reaction, when a stable gallium isotope absorbs a high energy photon, the nucleus becomes excited and produces either neutron(s) or proton(s). This process is called photonuclear reaction or photonuclear transmutation.

Gallium-based materials (i.e., workpieces) can be irradiated with high energy gamma rays to produce either n-type or p-type dopants under different irradiation conditions. Photonuclear transmutation doping possesses most of the advantages of a neutron transmutation process. For example, the doping profile of the photonuclear transmutation process is highly uniform. Photonuclear transmutation doping can also be conducted after the GaN growth process resulting in a very high-quality wafer.

One important advantage of the processes of the present invention compared to neutron transmutation is that the doped gallium-based semiconductor material is not radioactive after irradiation. Thus, the materials produced by the processes described herein do not require special handling after production.

Another important advantage of this process compared to neutron transmutation is that it can be used for both p-type and n-type doping by varying the energy of the photon beam. Ga can be transmuted to Ge or Zn depending on the energy of the incident photon. This is a significant advantage since most other doping processes require substantial modification to achieve different doping properties. Thus, photonuclear transmutation doping processes can provide for high quality n-type and p-type gallium-based materials (e.g., GaN wafers) for semiconductor applications. In some embodiments, the doped gallium-based semiconductor material is a p-type doped gallium-based semiconductor material. In further embodiments, the doped gallium-based semiconductor material is a n-type doped gallium-based semiconductor material.

Accordingly, in various embodiments, processes for producing a doped gallium-based semiconductor material comprise irradiating a gallium-based semiconductor workpiece with gamma rays to effect transmuting at least a portion of Ga in the workpiece to Zn and/or Ge to produce the doped gallium-based semiconductor material. In various embodiments, the gallium-based semiconductor workpiece used in the processes described herein can comprise at least one other component selected from group consisting of N, O, Sb, Ar, In, P, and combinations thereof. In some embodiments, the gallium-based semiconductor workpiece comprises GaN.

In some embodiments of the processes of the present invention, Ga is transmuted to Zn. The theoretical photonuclear reaction cross-sections for gallium isotopes have been calculated and are shown in FIGS. 1A-1D. With the incident photon in a certain energy range, gallium produces a proton and becomes a stable Zn atom, a p-type dopant to gallium-based semiconductor materials (e.g., GaN). Since the interaction between nuclei and photon is purely electromagnetic, the photonuclear reaction results in very little damage to the structure of the target samples. With the ability to penetrate deep into the target, photonuclear reaction doping processes result in a very uniform doping concentration throughout the workpiece.

There are two stable isotopes of gallium: $^{69}$Ga and $^{71}$Ga. Two common photonuclear reactions of a gallium element are photo-neutron and photo-proton. In the photo-neutron reaction, the gallium nucleus produces one ($\gamma$,1n) or two neutrons ($\gamma$,2n). In the photo-proton reaction, the gallium nucleus produces one ($\gamma$,1p) or two protons ($\gamma$,2p). To achieve the p-type doping of gallium-based semiconductor materials (e.g., GaN), the preferred reactions are:

$^{69}$Ga($\gamma$,1p)$^{68}$Zn and $^{71}$Ga($\gamma$,1p)$^{70}$Zn.

As such, in various embodiments, $^{69}$Ga is transmuted to $^{68}$Zn. In some embodiments, $^{71}$Ga is transmuted to $^{70}$Zn.

Other reactions, such as $^{69}$Ga($\gamma$,1n)$^{68}$Ga, $^{69}$Ga($\gamma$,2n)$^{67}$Ga, $^{69}$Ga($\gamma$,2p)$^{67}$Zn, $^{71}$Ga($\gamma$,1n)$^{70}$Ga, $^{71}$Ga($\gamma$,2n)$^{69}$Ga, and $^{71}$Ga($\gamma$,2p)$^{69}$Zn can also occur. Managing the energy of the incident photon is the key to achieve the desired reactions and ensure a successful photonuclear transmutation doping process.

FIGS. 1A, 1B, 1C, and 1D show that photo-neutron cross-sections of the $^{69}$Ga with the incident photon energy in the range of 10.5 MeV to 30 MeV are significantly higher than photo-proton cross-sections. However, the threshold energy of $^{69}$Ga($\gamma$,1p)$^{68}$Zn reaction is lower than the $^{69}$Ga($\gamma$,1n)$^{68}$Ga reaction. The $^{69}$Ga($\gamma$,1n)$^{68}$Ga reaction cross-section is zero when the incident photon energy is in the range of 7.5 to 10 MeV. In this energy range, only the $^{69}$Ga($\gamma$,1p)$^{68}$Zn reaction occur. Also, other reactions of $^{69}$Ga such as $^{69}$Ga($\gamma$,2n)$^{67}$Ga, $^{69}$Ga($\gamma$,2p)$^{67}$Zn will not become significant when the incident photon energy is higher than 19 MeV and 20.5 MeV, respectively. Using the incident photon energy in the range of 7.5 to 10 MeV will ensure the only photonuclear reaction of $^{69}$Ga is $^{69}$Ga($\gamma$,1p)$^{68}$Zn, the desired reaction for the p-type doping process of gallium-based semiconductor materials (e.g., GaN).

In the case of $^{71}$Ga, the threshold of the $^{71}$Ga($\gamma$,1n)$^{70}$Ga reaction and $^{71}$Ga($\gamma$,1p)$^{70}$Zn reaction are very close to each other around the value of 9.5 MeV as shown in FIGS. 2A, 2B, 2C, and 2D. Since the cross-section of the $^{71}$Ga($\gamma$,1n)$^{70}$Ga reaction is significantly higher than the $^{71}$Ga($\gamma$,1p)$^{70}$Zn reaction, it is difficult to generate Zn without a considerable amount of $^{70}$Ga. $^{70}$Ga is not stable and will likely decay to become $^{70}$Ge which is not favorable for the p-type doping process of GaN. Similarly to $^{69}$Ga, other reactions of $^{71}$Ga such as $^{71}$Ga($\gamma$,2n)$^{69}$Ga, and $^{71}$Ga($\gamma$,2p)$^{69}$Zn will not occur until the energy of the incident photon is higher where the possibility of the $^{71}$Ga($\gamma$,1p)$^{70}$Zn reaction is even lower. Given that, the photonuclear reaction of $^{71}$Ga to $^{70}$Zn will not be considered for the photonuclear transmutation doping for p-type GaN. In some embodiments, the production of zinc for a p-type doping process can be prioritized, for example, with the usage of a gallium-based workpiece (e.g., GaN wafer) with only Ga$^{69}$ isotope.

Tuning the gamma energy band and the usage of gallium-based workpieces (e.g., GaN wafers) with $^{69}$Ga or $^{71}$Ga are important to the doping process. Accordingly, in various embodiments, the gamma rays have an incident photon energy that is about 7.5 MeV or more. In some embodiments, gamma rays have an incident photon energy that is about 20.5 MeV or less. In certain embodiments, the gamma rays have an incident photon energy that is in the range of from about 7.5 MeV to about 10 MeV.

n-Type doping of GaN using photo nuclear reaction can also be achieved with the processes of the present invention using different photon energy for each Ga isotope. After absorbing the photon, a Ga atom becomes unstable and transmutes into Ge, an n-type dopant to GaN. Accordingly, in some embodiments, Ga is transmuted to Ge. As noted, selecting a photon energy range for each Ga isotope is important for the doping process. For example, in various embodiments, the gamma rays can have an incident photon energy that is about 9.5 MeV or more. In some embodiments, the gamma rays have an incident photon energy that is in the range of from about 9.5 MeV to about 50 MeV.

Figure 3:
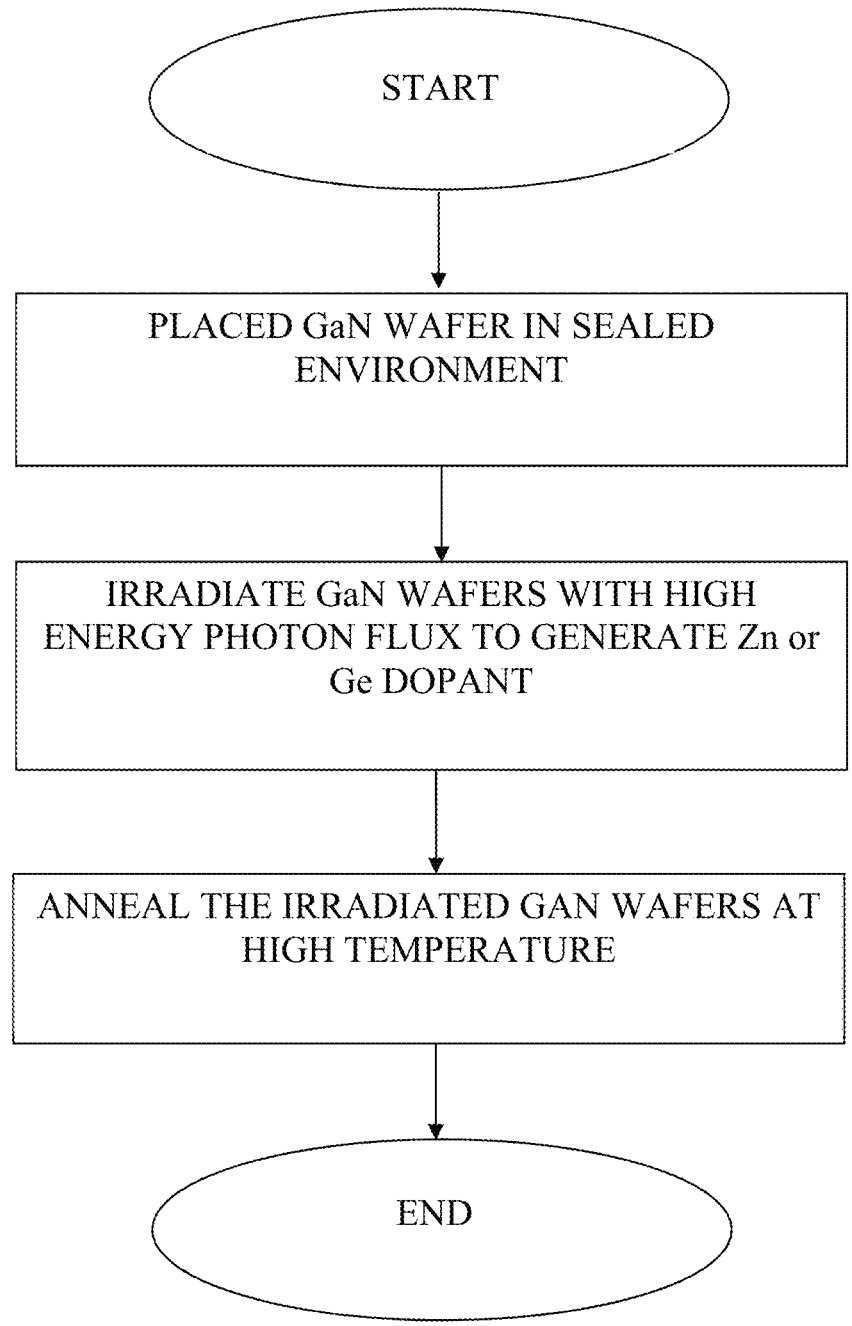
FIG. 3. The high-quality photo nuclear reaction doping process of GaN.

After the photon irradiation, an annealing step at high temperature for the doped gallium-based semiconductor material (e.g., doped GaN wafers) can be performed to reverse any radiation damage. An exemplary photonuclear reaction doping process of GaN, which includes an annealing step, is shown in FIG. 3.

Further, the gamma rays used in the processes described herein can be produced by various methods including a decaying radioactive isotope (e.g., oxygen) or in a linear accelerator. The photonuclear transmutation process requires a high energy and high-power gamma source to achieve a meaningful doping level. For example, the low energy accelerator facilities at Argonne National Lab can produce an energy range of from 15 MeV to 50 MeV, which is strong enough to dope gallium-based materials efficiently.

To produce a high energy, high power photon beam, electrons are converted into photons using an X-ray converter through the bremsstrahlung process. High Z materials such as Ta, W, Cu, Co, Fe are usually used for the X-ray converter to maximize the production of photons. The cooling process for the system can be challenging due to both high power density and small operating area. At a temperature higher than 100° C., the steam formation can affect the cooling efficiency of water. Using the water-cooling technique lowers the working power limit. However, it is chosen since other cooling processes present higher risks with high energy photons.

The calculation for the photon fluence needed for a $10^{17}$ doping concentration for a 1×1×0.035 cm$^{-3}$ GaN sample using gamma irradiation is shown below.

Atomic number density:

$$N = \frac{6.15}{83.73} \times 6.022 \times 10^{23} = 0.442 \times 10^{23} (\text{atom}/\text{cm}^3)$$

With: GaN density: 6.15 g/cm$^3$.
GaN molar mass: 83.73 g/mol
Cross-section for photonuclear reaction between GaN and 9 MeV photon:
σ=0.1 mbarn=$10^{-28}$ cm$^2$.
Flux needed for $10^{17}$ doping concentration:
Reaction rate: RR=φ×N×σ

$$\phi = \frac{RR}{N \times \sigma}$$

Number of reaction (or doping concentration) is the product of RR and time.
Fluence needed for $10^{17}$ doping concentration:

$$\Phi = \frac{\text{\# of reaction}}{N \times \sigma} = \frac{0.035 \times 10^{17}}{0.442 \times 10^{23} \times 10^{-28}}$$

$$\Phi = 0.0792 \times 10^{22} (\text{photon}/\text{cm}^2)$$

Energy needed:
If all photons are 9 MeV the Energy Density needed is:

$$E = \Phi \times 9 = 0.0792 \times 10^{22} \times 9 = 0.7127 \times 10^{22} (\text{MeV}/\text{cm}^2)$$

$$E = \frac{0.7127 \times 10^{22}}{6.242 \times 10^{12}} = 1.142 \times 10^9 \text{ J}/\text{cm}^2$$

(1 J = $6.242 \times 10^{12}$ MeV)

When power of the source is 10000 J/s
Time needed for irradiation is:

$$t = \frac{1.142 \times 10^9}{10000} = 114173 \text{ (s)} = 31.715 \text{ (hours)}$$

Various processes described herein can further comprise shielding at least a portion of the gallium-based semiconductor workpiece with a high-Z material during irradiation. For example, the high-Z material can comprise at least one component selected from the group consisting of Pb, W, Bi, Sn, Sb, Fe, Pt, Ta, a composite thereof and, a metal foam thereof. In some embodiments, the processes further comprise the step shielding a first region of the gallium-based semiconductor workpiece with a high-Z material during irradiation to selectively dope a second region of the workpiece that is unshielded.

Controlled selective doping can be achieved using high-Z metal as a mask/shield to partially block the photon beam. Some X-Ray and Gamma generators have built-in beam blocking mechanism which can deliver selective beam shape. These mechanisms can also be used to achieve selectively and vertically doped areas of a gallium-based workpiece (e.g., GaN wafer).

Figure 5:
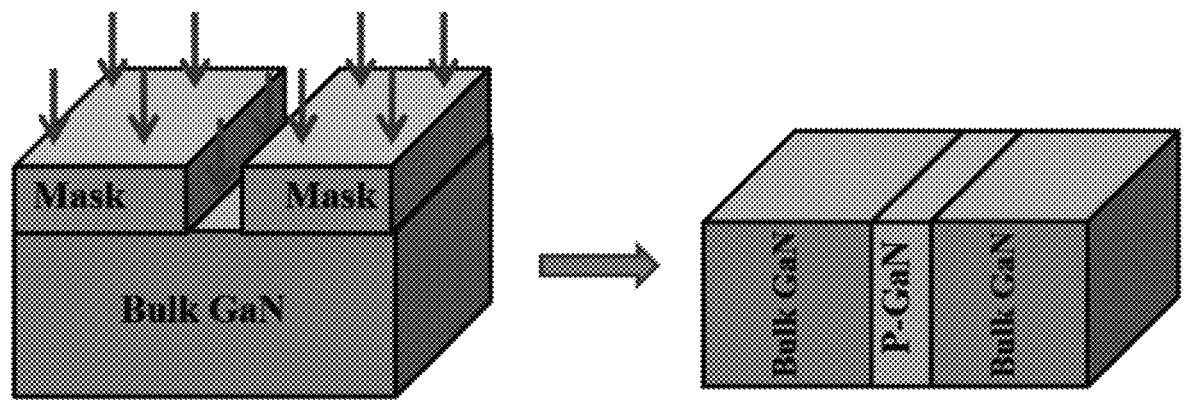
FIG. 5. Selective photonuclear transmutation doping process.

Selective doping for the photonuclear reaction process can be done using high-Z masking material after achieving the desired doping concentration. The ability to accomplish the selective doping process significantly expands the range of applications of p-type gallium-based semiconductor materials. Not only does the process allows p-type doping of the whole wafer but also directly facilitates the fabrication of semiconductor devices such as diodes and transistor. It can also be used as a supporting feature such as the p-well to improve the efficiency of the vertical GaN transistor. A selective photonuclear transmutation doping process is shown in FIG. 5.

Figure 6:
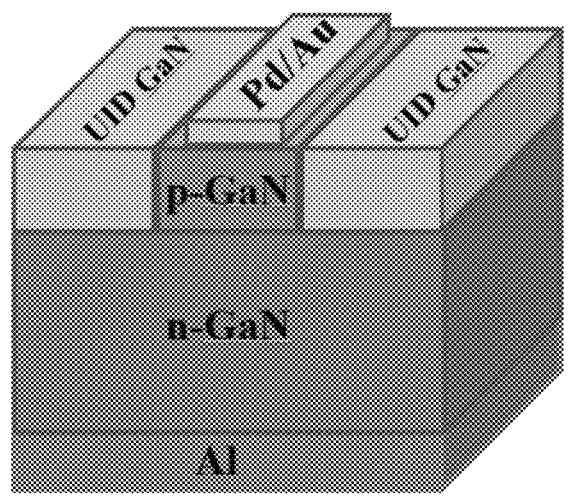
FIG. 6. GaN p-n junction using photonuclear transmutation doping process.
Figure 7:
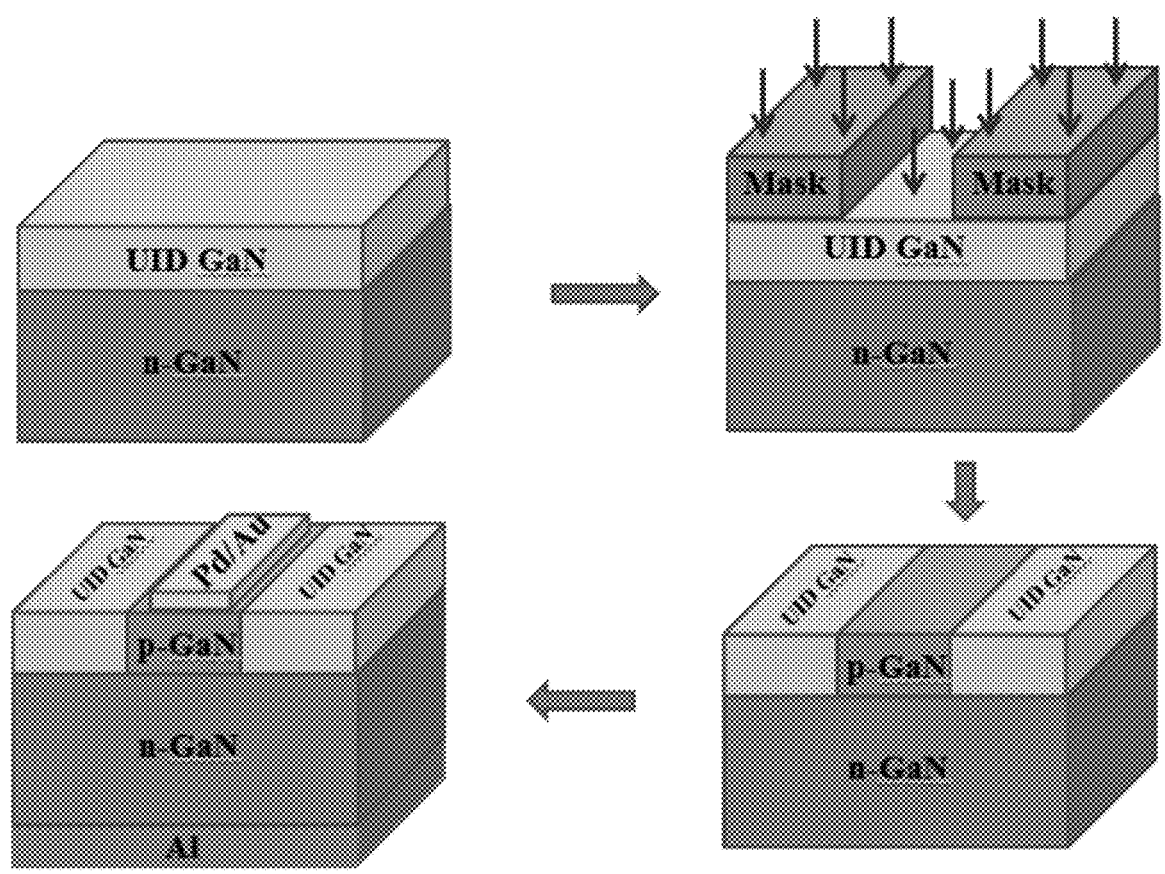
FIG. 7. Fabrication process of GaN p-n junction using photonuclear transmutation doping process.

The photonuclear doping process at the low energy accelerator facilities at Argonne National Laboratory can also be used to fabricate a GaN p-n junction, as shown in FIG. 6. Samples of an unintentionally doped (UID) GaN epitaxial layer on top of an n-type GaN can be irradiated with a high energy photon beam. After the irradiation process, the entire structure will have gallium transmuted into zinc. However, only the UID GaN epitaxial layer becomes p-type. The GaN wafer remains n-type because of the higher electron concentration. The contact for the p-type GaN can be achieved using Pd, Au, or a combination of different materials. The contact for the n-type GaN can be achieved using Al. FIG. 7 shows the fabrication process of a p-n junction diode using the selective photonuclear transmutation doping process.

Accordingly, the present invention further relates to various semiconductor materials. In some embodiments, the semiconductor material comprises: a first region comprising a doped gallium-based material (e.g., Zn-doped GaN or Ge-doped GaN as described herein); and a second region comprising an undoped gallium based material (e.g., GaN). In certain embodiments, the semiconductor material comprises: a first region comprising a doped p-type gallium-based material (e.g., Zn-doped GaN); and a second region comprising a n-type doped gallium based material (e.g., Ge-doped GaN). This material can further include a third region comprising an undoped gallium-based material (e.g., GaN).

Further, in various embodiments, these semiconductor materials can further include other components. For example, the semiconductor materials can include an Al-based contact layer. The semiconductor materials can also include other contact layers comprising, for example, Pd, Au, or other metals.

As noted, aspects of the present invention further relate to electronic components comprising the gallium-based semiconductor materials as described herein and as produced by the processes described herein. In various embodiments, the electronic component comprises a power semiconductor comprising the gallium-based semiconductor material. In some embodiments, the electronic component comprises a transistor or diode comprising the gallium-based semiconductor material.

Having described the invention in detail, it will be apparent that modifications and variations are possible without departing from the scope of the invention defined in the appended claims.

Examples

The following non-limiting examples are provided to further illustrate the present invention.

Figure 4:
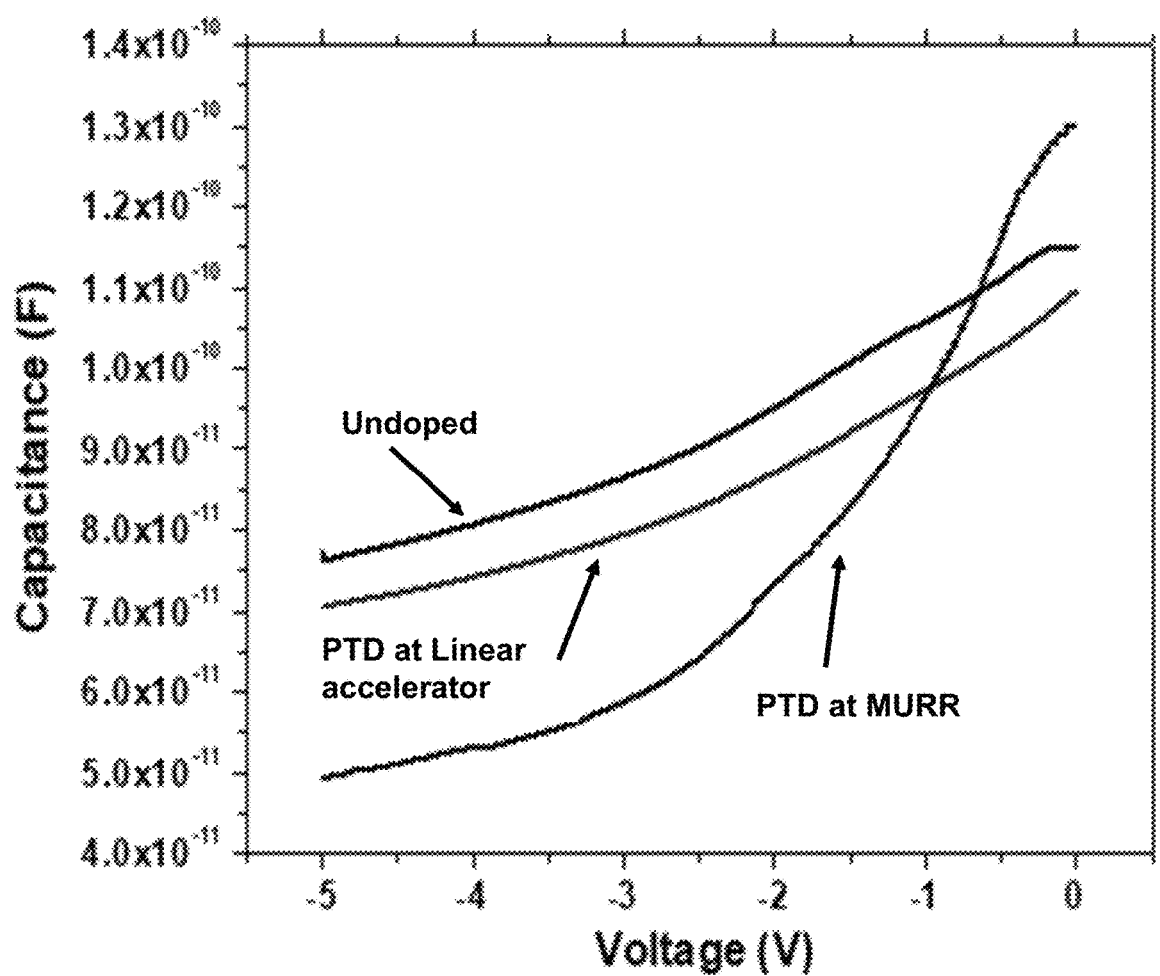
FIG. 4. C-V measurement of the photonuclear reaction transmutation doping of GaN.

Photonuclear reaction transmutation doping tests involve irradiating the GaN wafers with high energy photon. Two processes were used: Medical linear accelerator (LINAC) at Ellis Fischel Cancer Center and decaying oxygen isotope at MURR. The data in FIG. 4 shows that the sample irradiated at University of Missouri Research Reactor had significant change in the C-V curve. The calculated n-type carrier concentration from this test also shows a significant reduction from $5.46 \times 10^{16}$ cm$^{-3}$ to $1.62 \times 10^{16}$ cm$^{-3}$ as shown in Table 1. Thus, a p-type dopant was created in the sample. A stronger gamma source is needed for p-type doping of GaN using photonuclear reaction.

TABLE 1

Photonuclear reaction transmutation doping test results

| Sample | Carrier Concentration (cm$^{-3}$) |
|---|---|
| Untreated | $-5.46 \times 10^{16}$ |
| Irradiated (LINAC) | $-4.24 \times 10^{16}$ |
| Irradiated (Reactor) | $-1.62 \times 10^{16}$ |

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above compositions and processes without departing from the scope of the invention, it is intended that all matter contained in the above description and shown in the accompanying drawings shall be interpreted as illustrative and not in a limiting sense.

The invention claimed is:

1. A process for producing a doped gallium-based semiconductor material comprising:
   irradiating a gallium-based semiconductor workpiece with gamma rays in a photonuclear reaction to effect transmuting at least a portion of Ga in the workpiece to Zn and/or Ge to produce the doped gallium-based semiconductor material,
   wherein the gallium-based semiconductor workpiece comprises at least one other component selected from group consisting of N, O, Sb, In, and combinations thereof.

2. The process of claim 1, wherein Ga is transmuted to Zn.

3. The process of claim 1, wherein $^{69}$Ga is transmuted to $^{68}$Zn and/or $^{71}$Ga is transmuted to $^{70}$Zn.

4. The process of claim 1, wherein the gamma rays have an incident photon energy that is 7.5 MeV or more.

5. The process of claim 1, wherein the gamma rays have an incident photon energy that is 20.5 MeV or less.

6. The process of claim 2, wherein the gamma rays have an incident photon energy that is in the range of from 7.5 MeV to 10 MeV.

7. The process of claim 1, wherein the doped gallium-based semiconductor material is a p-type doped gallium-based semiconductor material.

8. The process of claim 1, wherein Ga is transmuted to Ge.

9. The process of claim 8, wherein the gamma rays have an incident photon energy that is 9.5 MeV or more.

10. The process of claim 8, wherein the gamma rays have an incident photon energy that is in the range of from 9.5 MeV to 50 MeV.

11. The process of claim 1, wherein the doped gallium-based semiconductor material is a n-type doped gallium-based semiconductor material.

12. The process of claim 1, further comprising shielding a first region of the gallium-based semiconductor workpiece with a high-Z material during irradiation to selectively dope a second region of the workpiece that is unshielded.

13. The process of claim 12, wherein the high-Z material comprises at least one component selected from the group consisting of Pb, W, Bi, Sn, Sb, Fe, Pt, Ta, a composite thereof, and metal foam thereof.

14. The process of claim 1, wherein the gallium-based semiconductor workpiece comprises GaN.

15. The process of claim 1, further comprising annealing the doped gallium-based semiconductor material.

16. The process of claim 1, wherein the doped gallium-based semiconductor material is not radioactive after irradiation.

17. A process for producing a doped gallium-based semiconductor material comprising:
   irradiating a gallium-based semiconductor workpiece with gamma rays in a photonuclear reaction to effect transmuting at least a portion of Ga in the workpiece to Zn and/or Ge to produce the doped gallium-based semiconductor material,
   wherein the gallium-based semiconductor workpiece comprises gallium oxide.

* * * * *